(12) United States Patent
Park

(10) Patent No.: US 11,048,169 B2
(45) Date of Patent: Jun. 29, 2021

(54) RESIST UNDERLAYER COMPOSITION, AND METHOD OF FORMING PATTERNS USING THE COMPOSITION

(71) Applicant: SAMSUNG SDI CO., LTD., Yongin-si (KR)

(72) Inventor: Hyeon Park, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 146 days.

(21) Appl. No.: 16/214,229

(22) Filed: Dec. 10, 2018

(65) Prior Publication Data

US 2019/0196332 A1   Jun. 27, 2019

(30) Foreign Application Priority Data

Dec. 26, 2017   (KR) .......................... 10-2017-0180153

(51) Int. Cl.
*G03F 7/11* (2006.01)
*G03F 7/00* (2006.01)
(Continued)

(52) U.S. Cl.
CPC .............. *G03F 7/11* (2013.01); *C08F 226/06* (2013.01); *C08G 61/04* (2013.01); *G03F 7/0035* (2013.01);
(Continued)

(58) Field of Classification Search
CPC . C08F 226/06; C08G 61/04; C08G 2261/149; C08G 2261/1644;
(Continued)

(56) References Cited

U.S. PATENT DOCUMENTS 4,266,055 A * 5/1981 Inoue .................... C07D 251/34
544/221
7,470,500 B2  12/2008 Yao et al.
(Continued)

FOREIGN PATENT DOCUMENTS

CN   102763037 A   10/2012
CN   107001930 A    8/2017
(Continued)

OTHER PUBLICATIONS

Gadwal, I., Binder, S., Stuparu. M.C., Khan, A.—Dual-Reactive Hyperbranched Polymer Synthesis through Proton Transfer Polymerization of Thiol and Epoxide Groups, Macromolecules, 2014, 47, pp. 5070-5080, published on Jul. 16, 2014 (Year: 2014).*
(Continued)

Primary Examiner — Anca Eoff

(74) Attorney, Agent, or Firm — Lee IP Law, P.C.

(57) ABSTRACT

A resist underlayer composition and a method of forming patterns, the composition including a solvent; and a polymer having a structure where at least one of a first moiety represented by one of Chemical Formula 1-1 to Chemical Formula 1-3 is combined with a third moiety represented by Chemical Formula 3, or at least one of a second moiety represented by one of Chemical Formula 2-1 to Chemical Formula 2-3 is combined with a third moiety represented by Chemical Formula 3

[Chemical Formula 1-1]

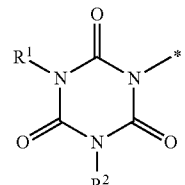

[Chemical Formula 1-2]

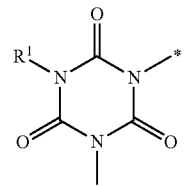

[Chemical Formula 1-3]

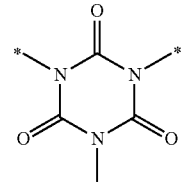

[Chemical Formula 2-1]

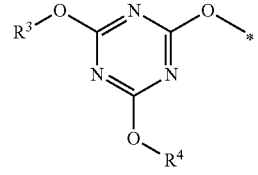

[Chemical Foormula 2-2]

[Chemical Formula 2-3]

(Continued)

-continued

[Chemical Formula 3]

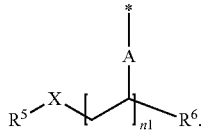

17 Claims, 5 Drawing Sheets

(51) Int. Cl.
  *G03F 7/20* (2006.01)
  *C08G 61/04* (2006.01)
  *G03F 7/26* (2006.01)
  *G03F 7/09* (2006.01)
  *G03F 7/004* (2006.01)
  *C08F 226/06* (2006.01)

(52) U.S. Cl.
  CPC .............. *G03F 7/091* (2013.01); *G03F 7/094* (2013.01); *G03F 7/2002* (2013.01); *G03F 7/26* (2013.01); *C08G 2261/149* (2013.01); *C08G 2261/1644* (2013.01); *G03F 7/0045* (2013.01)

(58) Field of Classification Search
  CPC ...... G03F 7/0035; G03F 7/0045; G03F 7/091; G03F 7/094; G03F 7/11; G03F 7/2002; G03F 7/26
  See application file for complete search history.

(56) References Cited

U.S. PATENT DOCUMENTS

| | | | |
|---|---|---|---|
| 7,931,825 B2 | 4/2011 | Irisawa et al. | |
| 8,507,192 B2 * | 8/2013 | Yao | G03F 7/091 430/325 |
| 2006/0069171 A1 * | 3/2006 | Prokopowicz | H01L 21/3121 521/61 |
| 2012/0161088 A1 | 6/2012 | Choi et al. | |
| 2013/0164695 A1 | 6/2013 | Nishimura et al. | |
| 2014/0087311 A1 | 3/2014 | Nakasugi et al. | |
| 2016/0195806 A1 * | 7/2016 | Lee | G03F 7/0007 430/7 |
| 2017/0351178 A1 * | 12/2017 | Roh | G03F 7/038 |

FOREIGN PATENT DOCUMENTS

| | | |
|---|---|---|
| EP | 2165830 A1 | 3/2010 |
| JP | 11-218919 A | 8/1999 |
| JP | 11-218920 A | 8/1999 |
| JP | 2005-321752 A | 11/2005 |
| JP | 5382321 B2 | 1/2014 |
| JP | 5816502 B2 | 11/2015 |
| JP | 2017-040833 A | 2/2017 |
| KR | 10-2013-0079150 A | 7/2013 |
| KR | 10-2014-0085123 A | 7/2014 |
| KR | 10-1566532 B1 | 10/2015 |
| KR | 10-1590608 B1 | 1/2016 |
| KR | 10-1657052 B1 | 9/2016 |
| KR | 10-2018-0090640 A | 8/2018 |
| TW | I 258634 | 7/2006 |
| TW | 201615623 A | 5/2016 |
| WO | WO 2011-081316 A2 | 7/2011 |

OTHER PUBLICATIONS

Mazzier, D., Maran, M., Perucchin, O.P., Crisma, M., Zerbetto, M., Causin, V., Toniolo, C., Moretto, A.—Photoresponsive Supramolecular Architectures Based on Polypeptide Hybrids, Macromolecules, 2014, 47, pp. 7272-7283, published on Oct. 24, 2014 (Year: 2014).*

Machine translation of KR 10-2013-0079150, published on Jul. 10, 2013 (Year: 2013).*

Taiwanese Office action dated Oct. 1, 2019.

* cited by examiner

RESIST UNDERLAYER COMPOSITION, AND METHOD OF FORMING PATTERNS USING THE COMPOSITION

CROSS-REFERENCE TO RELATED APPLICATION

Korean Patent Application No. 10-2017-0180153 filed on Dec. 26, 2017, in the Korean Intellectual Property Office, and entitled: "Resist Underlayer Composition, and Method of Forming Patterns Using the Composition," is incorporated by reference herein in its entirety.

BACKGROUND

1. Field

Embodiments relate to a resist underlayer composition and a method of forming patterns using the same.

2. Description of the Related Art

Recently, the semiconductor industry has developed to an ultra-fine technique having a pattern of several to several tens of nanometer size. Such ultrafine technique essentially needs effective lithographic techniques.

The lithographic technique may include coating a photoresist layer on a semiconductor substrate such as a silicon wafer, exposing and developing it to form a thin layer, irradiating activated radiation such as ultraviolet (UV) while disposing a mask pattern having a pattern of a device, developing the resultant to obtain a photoresist pattern, etching the substrate using the photoresist pattern as a protective layer to form a fine pattern corresponding to the pattern on the surface of the substrate.

SUMMARY

The embodiments may be realized by providing a resist underlayer composition including a solvent; and a polymer having a structure where at least one of a first moiety represented by one of Chemical Formula 1-1 to Chemical Formula 1-3 is combined with a third moiety represented by Chemical Formula 3, or at least one of a second moiety represented by one of Chemical Formula 2-1 to Chemical Formula 2-3 is combined with a third moiety represented by Chemical Formula 3,

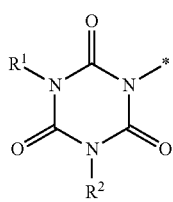

[Chemical Formula 1-1]

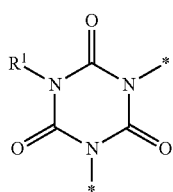

[Chemical Formula 1-2]

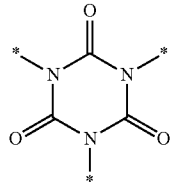

[Chemical Formula 1-3]

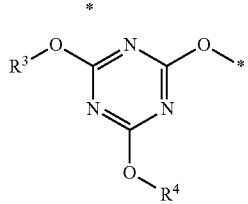

[Chemical Formula 2-1]

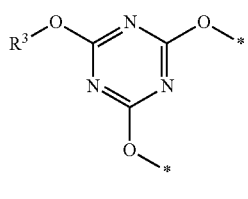

[Chemical Formula 2-2]

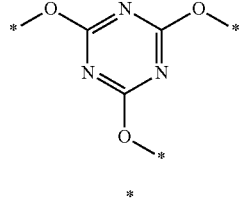

[Chemical Formula 2-3]

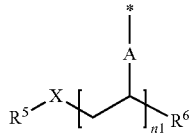

[Chemical Formula 3]

wherein, in Chemical Formulae 1-1 to 1-3 and Chemical Formulae 2-1 to 2-3, $R^1$ to $R^4$ are independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, and each * of Chemical Formulae 1-1 to Chemical Formulae 2-3 is a linking point, wherein, in Chemical Formula 3, A is a single bond, a substituted or unsubstituted C1 to C10 alkylene group, —C(=O)—, —(CO)O—, —O(CO)O—, or a combination thereof, X is a single bond, —O—, —S—, —S(=O)—, —S(=O)$_2$—, —C(=O)—, —(CO)O—, —O(CO)O—, —NR—, in which R is hydrogen, deuterium, or a C1 to C10 alkyl group, or a combination thereof, $R^5$ is hydrogen, deuterium, a halogen, a hydroxy group, a cyano group, a nitro group, an amino group, an epoxy group, a vinyl group, a (meth)acrylate group, an oxetane group, a thiol group, a carboxyl group or a salt thereof, a sulfonic acid group or a salt thereof, a phosphoric acid group or a salt thereof, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C3 to C10 cycloalkyl group, a substituted or unsubstituted C1 to C30 thioalkyl group, a substituted or unsubstituted C6 to C30 aryl group, a substituted or unsubstituted C2 to C30 heteroaryl group, a substituted or unsubstituted C6 to C30 aryloxy group, a substituted or unsubstituted C6 to C30 thioaryl group, or a combination thereof. $R^6$ is hydrogen, deuterium, a substituted or unsubstituted C1 to C30 alkyl group, or a substituted or unsubstituted C6 to C30 aryl group, n1 is an integer of 1 to 10,000, and * is a linking point with * of Chemical Formula 1-1 to Chemical Formula 2-3.

$R^5$ of Chemical Formula 3 may be a group represented by Chemical Formula 4,

*—(CH$_2$)$_{n2}$-L-(CH$_2$)$_{n3}$—R$^a$, and [Chemical Formula 4]

in Chemical Formula 4, L is —O—, —S—, —S(=O)—, —S(=O)—, —S(—O)$_2$, —C(=O)—, —(CO)O—, —O(CO)O—, a substituted or unsubstituted C1 to C20 alkylene group, a substituted or unsubstituted C2 to C10 alkenylene group, a substituted or unsubstituted C2 to C10 alkynylene group, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, $R^a$ is hydrogen, deuterium, a halogen, a hydroxy group, a thiol group, a cyano group, a nitro group, an amino group, an epoxy group, an oxetane group, a vinyl group, a (meth)acrylate group, a carboxyl group or a salt thereof, a sulfonic acid group or a salt thereof, a phosphoric acid group or a salt thereof, a substituted or unsubstituted C1 to C30 alkyl group, a substituted or unsubstituted C1 to C10 alkoxy group, a substituted or unsubstituted C1 to C30 thioalkyl group, a substituted or unsubstituted C3 to C10 cycloalkyl group, a substituted or unsubstituted C6 to C30 aryl group, a substituted or unsubstituted C2 to C30 heteroaryl group, or a combination thereof, n2 and n3 are independently an integer of 0 to 10, and * is a linking point with X.

X of Chemical Formula 3 may be —S—.

In Chemical Formula 3, A may be a substituted or unsubstituted C1 to C5 alkylene group, —C(=O)—, or a combination thereof, X may be —S—, $R^5$ may be a halogen, a hydroxy group, a cyano group, a nitro group, an amino group, an epoxy group, an oxetane group, a vinyl group, a (meth)acrylate group, a thiol group, a carboxyl group, a substituted or unsubstituted C1 to C30 alkyl group, a substituted or unsubstituted C6 to C30 aryl group, a substituted or unsubstituted C2 to C30 heteroaryl group, or a combination thereof, and $R^6$ may be hydrogen, deuterium, a substituted or unsubstituted C1 to C30 alkyl group, or a substituted or unsubstituted C6 to C30 aryl group.

The polymer may be represented by one of Chemical Formula 5-1, Chemical Formula 5-2, Chemical Formula 5-3, Chemical Formula 6-1, Chemical Formula 6-2, or Chemical Formula 6-3:

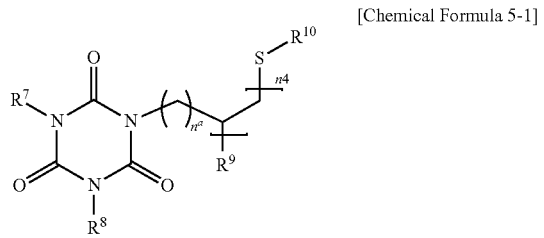

[Chemical Formula 5-1]

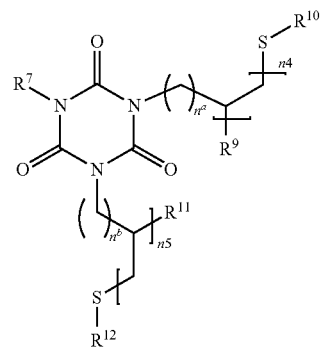

[Chemical Formula 5-2]

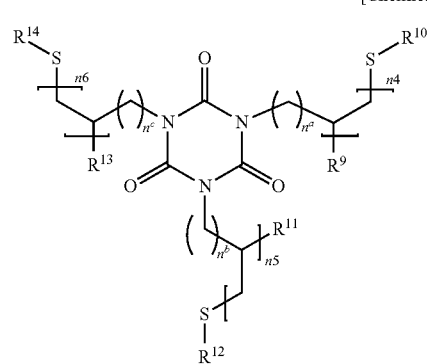

[Chemical Formula 5-3]

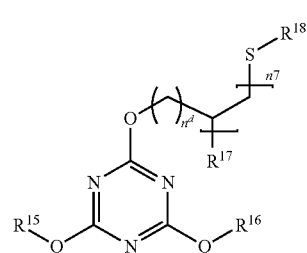

[Chemical Formula 6-1]

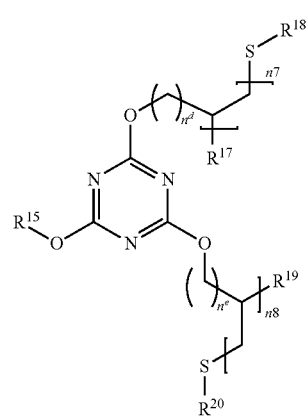

[Chemical Formula 6-2]

-continued

[Chemical Formula 6-3]

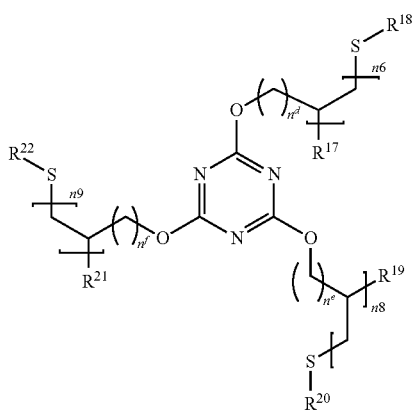

wherein, in Chemical Formula 5-1 to 5-3 and Chemical Formula 6-1 to 6-3, $R^7$, $R^8$, $R^{15}$, and $R^{16}$ may be independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, $R^9$, $R^{11}$, $R^{13}$, $R^{17}$, $R^{19}$, and $R^{21}$ may be independently hydrogen, deuterium, C1 to C30 substituted or unsubstituted alkyl group, or C6 to C30 substituted or unsubstituted aryl group, $R^{10}$, $R^{12}$, $R^{14}$, $R^{18}$, $R^{20}$, and $R^{22}$ may be independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C3 to C10 cycloalkyl group, a substituted or unsubstituted C1 to C30 thioalkyl group substituted or unsubstituted C6 to C30 aryl group, a substituted or unsubstituted C6 to C30 aryloxy group, a substituted or unsubstituted C6 to C30 thioaryl group, or a combination thereof, n4 to n9 may be independently an integer of 2 to 100, and $n^a$ to $n^f$ may be independently an integer of 1 to 5.

$R^{10}$, $R^{12}$, $R^{14}$, $R^{18}$, $R^{20}$, and $R^{22}$ may be independently a group represented by Chemical Formula 4:

*—$(CH_2)_{n2}$-L-$(CH_2)_{n3}$—$R^a$, and [Chemical Formula 4]

in Chemical Formula 4, L may be —O—, —S—, —S(=O)—, —S(=O)—, —S(—O)$_2$, —C(=O)—, —(CO)O—, —O(CO)O—, a substituted or unsubstituted C1 to C20 alkylene group, a substituted or unsubstituted C2 to C10 alkenylene group, a substituted or unsubstituted C2 to C10 alkynylene group, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, $R^a$ may be hydrogen, a hydroxy group, a thiol group, or a carboxyl group or a salt thereof, n2 and n3 may be independently an integer of 0 to 5, and * of Chemical Formula 4 is a linking point with S.

$R^7$, $R^8$, $R^{15}$, and $R^{16}$ may be independently a group represented by Chemical Formula 7:

*—$(CH_2)_{n10}$-E, and [Chemical Formula 7]

in Chemical Formula 7, E may be a hydroxy group, a (meth)acrylate group, or a carboxyl group, and n10 may be an integer of 0 to 10.

$R^1$, $R^2$, $R^3$ and $R^4$ may be independently a group represented by Chemical Formula 7:

*—$(CH_2)_{n10}$-E, and [Chemical Formula 7]

in Chemical Formula 7, E may be a hydroxy group, a (meth)acrylate group, or a carboxyl group, and n10 may be an integer of 0 to 10.

The polymer may be represented by one of Chemical Formulae 8 to 11:

[Chemical Formula 8]

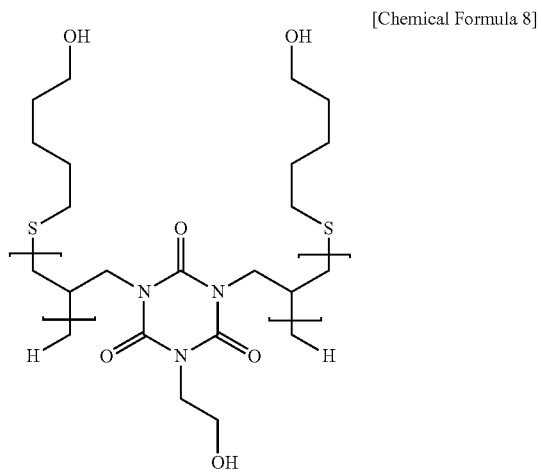

[Chemical Formula 9]

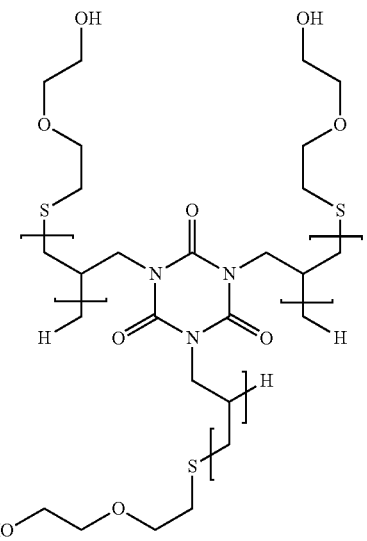

[Chemical Formula 10]

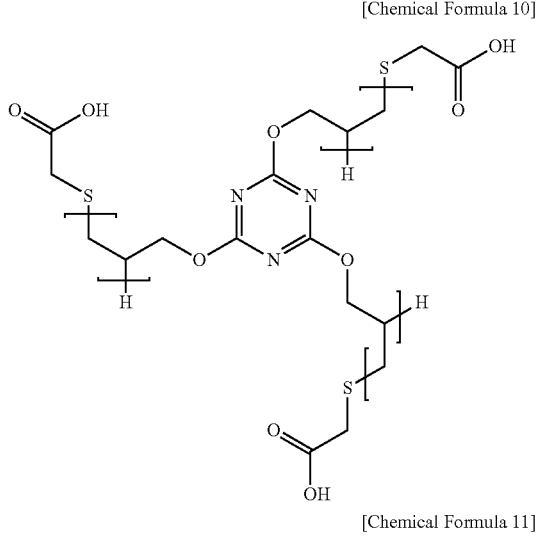

[Chemical Formula 11]

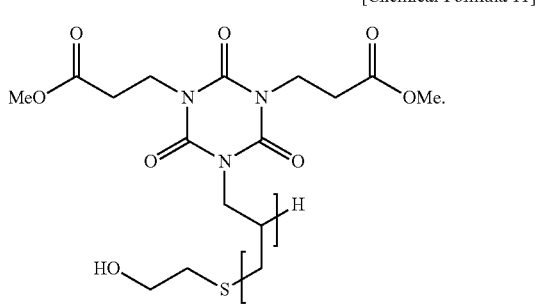

The polymer may have a weight average molecular weight of about 1,000 to about 100,000.

The polymer may be included in the composition in an amount of about 0.1 wt % to about 50 wt %, based on a total weight of the composition.

The resist underlayer composition may further include a cross-linking agent having at least two cross-linking sites.

The resist underlayer composition may further include a surfactant, a thermal acid generator, a plasticizer, or a combination thereof.

The embodiments may be realized by providing a method of forming patterns, the method including forming an etching subject layer on a substrate, coating the resist underlayer composition according to an embodiment on the etching subject layer to form a resist underlayer, forming a photoresist pattern on the resist underlayer, and sequentially etching the resist underlayer and the etching subject layer using the photoresist pattern as an etching mask.

Forming the photoresist pattern may include forming a photoresist layer on the resist underlayer, exposing the photoresist layer, and developing the photoresist layer.

Forming the resist underlayer may further include heat-treating the coated resist underlayer composition at a temperature of about 100° C. to about 500° C.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
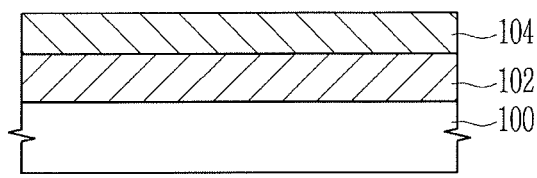
FIGS. 1 to 5 illustrate cross-sectional views of stages in a method of forming patterns using a resist underlayer composition according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., are exaggerated for clarity and like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, 'substituted' refers to replacement of a hydrogen atom of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term 'hetero' refers to one including 1 to 3 heteroatoms selected from N, O, S, and P.

As used herein, when a definition is not otherwise provided, refers to a linking point of a compound or a compound moiety.

Hereinafter, a resist underlayer composition according to an embodiment is described.

According to an embodiment, a resist underlayer composition may include a solvent and a polymer having a structure where at least one of a first moiety represented by one of Chemical Formula 1-1 to Chemical Formula 1-3 or a second moiety represented by one of Chemical Formula 2-1 to Chemical Formula 2-3, and a third moiety represented by Chemical Formula 3 are combined.

[Chemical Formula 1-1]

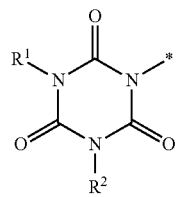

-continued

[Chemical Formula 1-2]

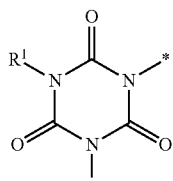

[Chemical Formula 1-3]

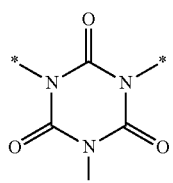

[Chemical Formula 2-1]

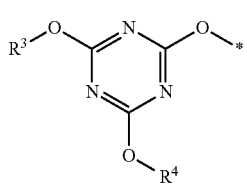

[Chemical Formula 2-2]

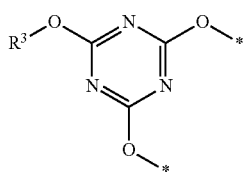

[Chemical Formula 2-3]

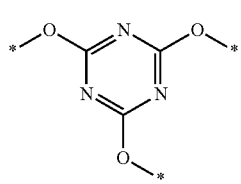

In Chemical Formulae 1-1 to 1-3 and Chemical Formulae 2-1 to 2-3, $R^1$ to $R^4$ may each independently be or include, e.g., hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, and each * of Chemical Formulae 1-1 to Chemical Formulae 2-3 may be a linking point (e.g., to another linking point indicated as *).

In an implementation, $R^1$, $R^2$, $R^3$, and $R^4$ may independently be a group represented by Chemical Formula 7.

*—(CH$_2$)$_{n10}$-E　　　[Chemical Formula 7]

In Chemical Formula 7,

E may be, e.g., a hydroxy group, a (meth)acrylate group, and a carboxyl group, and n10 may be, e.g., an integer of 0 to 10.

The first moiety may have a cyanuric acid backbone in the center (e.g., core), and the second moiety may include a triazine backbone or core. By such a structure, a relatively high refractive index (n) and a low extinction coefficient (k) with respect to light transferred from a light source used in a photoresist may be realized.

For example, the structures having a cyanuric acid core like the first moiety represented by Chemical Formulae 1-1 to 1-3 or a triazine core like the second moiety represented by Chemical Formulae 2-1 to 2-3 may have a high refractive index and a low extinction coefficient regarding an activating radiation of using light or energy having a high energy wavelength such as EUV (Extreme Ultraviolet, a wavelength: 13.5 nm), an E-beam (electron beam), and the like as well as light having a short wavelength such as i-line (wavelength: 365 nm). a KrF excimer laser (wavelength: 248 nm), an ArF excimer laser (wavelength: 193 nm), and the like.

In addition, the structures having a cyanuric acid core like the first moiety represented by Chemical Formulae 1-1 to 1-3 or a triazine core like the second moiety represented by Chemical Formulae 2-1 to 2-3 may help improve solubility in a solvent and also improve durability of a photoresist regarding the solvent.

Accordingly, when the composition including the polymer including at least one of the first moiety or the second moiety is used, e.g., as a photoresist underlayer material, the composition may exhibit optimized reflectance from an etched layer regarding a light source and thus may help suppress a light interference effect and in addition, have high etch selectivity with a photoresist layer during the etching process and excellent flatness.

In an implementation, as described above, each of the portion indicated by*of the first moiety and the second moiety may be linked with the third moiety represented by Chemical Formula 3.

[Chemical Formula 3]

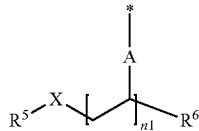

In Chemical Formula 3,

A may be or may include, e.g., a single bond, a substituted or unsubstituted C1 to C10 alkylene group, —C(=O)—, —(CO)O—, —O(CO)O—, or a combination thereof, X may be, e.g., a single bond, —O—, —S—, —S(=O)—, —S(=O)—, —S(=O)$_2$—, —C(=O)—, —(CO)O—, —O(CO)O—, —NR— (in which R is hydrogen, deuterium, or a C1 to C10 alkyl group), or a combination thereof, $R^5$ may be or may include, e.g., hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C3 to C10 cycloalkyl group, a substituted or unsubstituted C1 to C30 thioalkyl group, a substituted or unsubstituted C6 to C30 aryl group, a substituted or unsubstituted C6 to C30 aryloxy group, a substituted or unsubstituted C6 to C30 thioaryl group, or a combination thereof, $R^6$ may be or may include, e.g., hydrogen, deuterium, or a substituted or unsubstituted C1 to C10 alkyl group, n1 may be an integer of 2 to 100, and

* may be a linking point with * of Chemical Formulae 1-1 to 1-3 and Chemical Formulae 2-1 to 2-3. For example, each * position of the first moiety and the second moiety may be linked with * of the third moiety represented by Chemical Formula 3.

In an implementation, $R^5$ of Chemical Formula 3 may be, e.g., a group represented by Chemical Formula 4.

   [Chemical Formula 4]

L may be or may include, e.g., —O—, —S—, —S(=O)—, —S(=O)—, —S(—O)$_2$, —C(=O)—, —(CO)O—, —O(CO)O—, a substituted or unsubstituted C1 to C20 alkylene group, a substituted or unsubstituted C2 to C10 alkenylene group, a substituted or unsubstituted C2 to C10 alkynylene group, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, $R^a$ may be or may include, e.g., hydrogen, deuterium, a halogen, a hydroxy group, a thiol group, a cyano group, a nitro group, an amino group, an epoxy group, an oxetane group, a vinyl group, a (meth)acrylate group, a carboxyl group or a salt thereof, a sulfonic acid group or a salt thereof, a phosphoric acid group or a salt thereof, a substituted or unsubstituted C1 to C30 alkyl group, a substituted or unsubstituted C1 to C10 alkoxy group, a substituted or unsubstituted C1 to C30 thioalkyl group, a substituted or unsubstituted C3 to C10 cycloalkyl group, a substituted or unsubstituted C6 to C30 aryl group, a substituted or unsubstituted C2 to C30 heteroaryl group, or a combination thereof, n2 and n3 may independently be, e.g., an integer of 0 to 10, and

* is a linking point with X of Chemical Formula 3.

In an implementation, the polymer may include at least one third moiety in which X of Chemical Formula 3 is —S—. When the polymer includes sulfur (S), a high refractive index may be realized and a fast etch rate may be embodied.

In an implementation, in Chemical Formula 3, e.g., A may be a substituted or unsubstituted C1 to C5 alkylene group, —C(=O)—, or a combination thereof, X may be —S—, $R^5$ may be a halogen, a hydroxy group, a cyano group, a nitro group, an amino group, an epoxy group, an oxetane group, a vinyl group, a (meth)acrylate group, a thiol group, a carboxyl group, a C1 to C30 alkyl group, a C6 to C30 aryl group, a C2 to C30 heteroaryl group, or a combination thereof, and $R^6$ may be hydrogen, deuterium, a C1 to C30 substituted or unsubstituted alkyl group, or a C6 to C30 substituted or unsubstituted aryl group.

In an implementation, the polymer may be represented by one of the following Chemical Formula 5-1 to Chemical Formula 5-3 and Chemical Formula 6-1 to Chemical Formula 6-3.

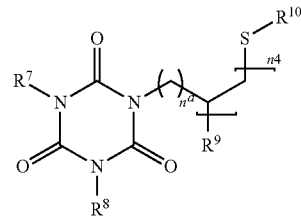   [Chemical Formula 5-1]

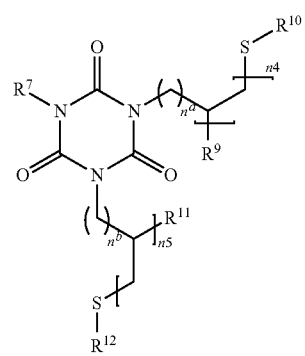   [Chemical Formula 5-2]

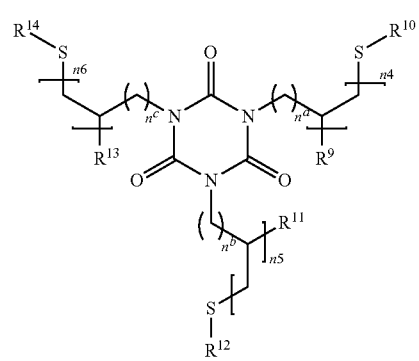   [Chemical Formula 5-3]

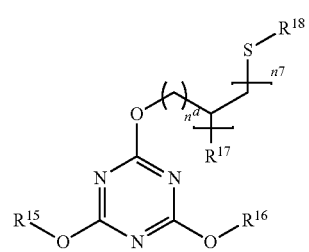   [Chemical Formula 6-1]

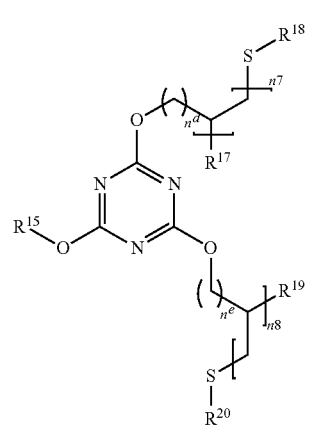   [Chemical Formula 6-2]

-continued

[Chemical Formula 6-3]

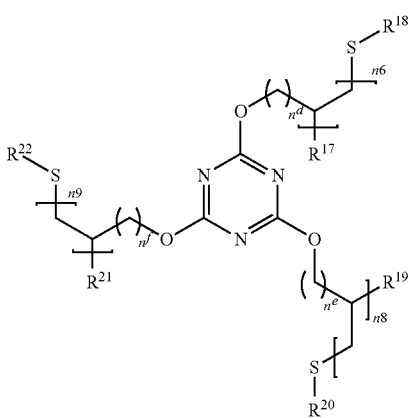

In Chemical Formulae 5-1 to 5-3 and 6-1 to 6-3, $R^7$, $R^8$, $R^{15}$, and $R^{16}$ may each independently be or include, e.g., hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, $R^9$, $R^{11}$, $R^{13}$, $R^{17}$, $R^{19}$, and $R^{21}$ may each independently be or include, e.g., hydrogen, deuterium, a substituted or unsubstituted C1 to C30 alkyl group, or a substituted or unsubstituted C6 to C30 aryl group, $R^{10}$, $R^{12}$, $R^{14}$, $R^{18}$, $R^{20}$, and $R^{22}$ may each independently be or include, e.g., hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C3 to C10 cycloalkyl group, a substituted or unsubstituted C1 to C30 thioalkyl group substituted or unsubstituted C6 to C30 aryl group, a substituted or unsubstituted C6 to C30 aryloxy group, a substituted or unsubstituted C6 to C30 thioaryl group, or a combination thereof, n4 to n9 may each independently be, e.g., an integer of 1 to 10,000, and $n^a$ to $n^f$ may each independently be, e.g., an integer of 1 to 5.

In an implementation, $R^{10}$, $R^{12}$, $R^{14}$, $R^{18}$, $R^{20}$, and $R^{22}$ may each independently be, e.g., a group represented by Chemical Formula 4.

*—$(CH_2)_{n2}$-L-$(CH_2)_{n3}$—$R^a$ [Chemical Formula 4]

L may be or may include, e.g., —O—, —S—, —S(=O)—, —S(=O)—, —S(=O)$_2$—, —C(=O)—, —(CO)O—, —O(CO)O—, a substituted or unsubstituted C1 to C20 alkylene group, a substituted or unsubstituted C2 to C10 alkenylene group, a substituted or unsubstituted C2 to C10 alkynylene group, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, $R^a$ may be, e.g., hydrogen, a hydroxy group, a thiol group, a carboxyl group, or a salt thereof, n2 and n3 may each independently be, e.g., an integer of 0 to 5, and

* of Chemical Formula 4 is a linking point with one of S of Chemical Formula 5-1 to Chemical Formula 5-3, or Chemical Formula 6-1 to Chemical Formula 6-3.

In an implementation, $R^7$, $R^8$, $R^{15}$, or $R^{16}$ may each independently be, e.g., a group represented by Chemical Formula 7.

*—$(CH_2)_{n10}$-E [Chemical Formula 7]

In Chemical Formula 7,

E may be, e.g., a hydroxy group, a (meth)acrylate group, or a carboxyl group, and n10 may be, e.g., an integer of 0 to 10.

In an implementation, the polymer may be represented by one of Chemical Formulae 8 to 11.

[Chemical Formula 8]

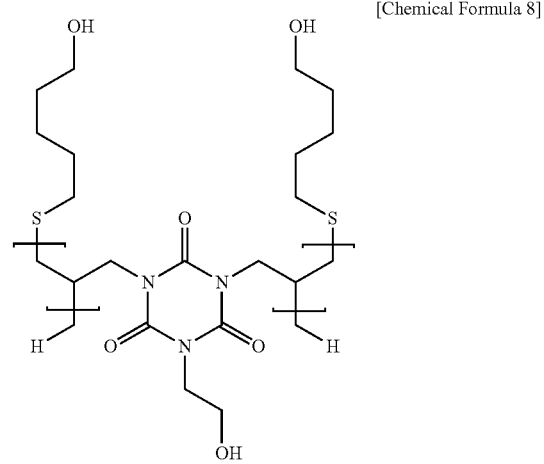

[Chemical Formula 9]

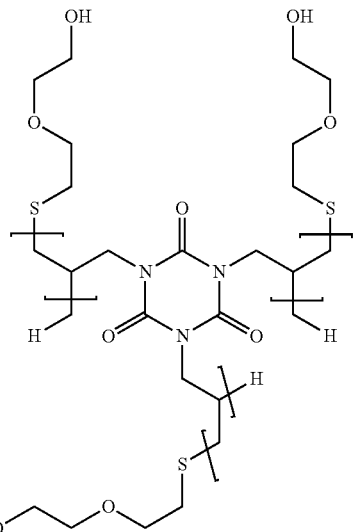

[Chemical Formula 10]

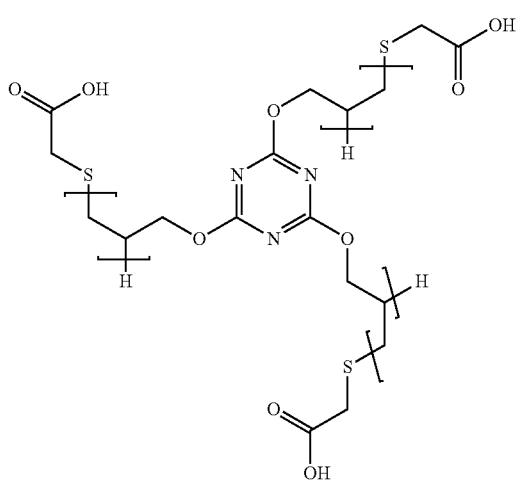

[Chemical Formula 11]

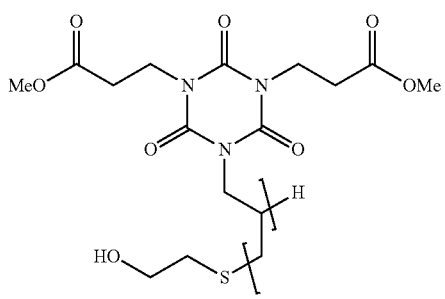

In an implementation, the polymer according to an embodiment may be prepared by, e.g., copolymerizing at least one compound of Chemical Formulae 12-1 to 12-3 and 13-1 to 13-3 with a compound represented by Chemical Formula 14.

[Chemical Formula 12-1]

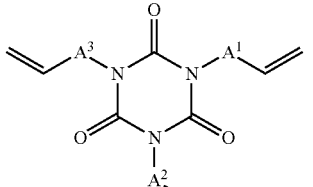

[Chemical Formula 12-2]

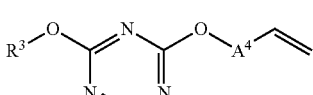

[Chemical Formula 12-3]

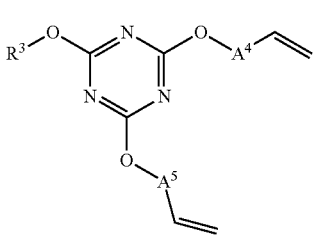

[Chemical Formula 13-1]

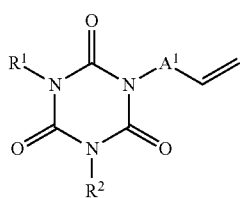

[Chemical Formula 13-2]

[Chemical Formula 13-3]

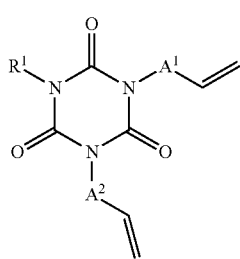

In Chemical Formulae 12-1 to 12-3 and 13-1 to 13-3, $A^1$ to $A^6$ may each independently be or include, e.g., a single bond, a substituted or unsubstituted C1 to C10 alkylene group, —C(=O)—, —(CO)O—, —O(CO)O—, or a combination thereof, and $R^1$ to $R^4$ may each independently be or include, e.g., hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof.

In an implementation, $A^1$ to $A^6$ in Chemical Formulae 12-1 to 12-3 and 13-1 to 13-3 may be defined the same as A in Chemical Formula 3, and $R^1$ to $R^4$ in Chemical Formulae 12-1 to 12-3 and 13-1 to 13-3 may be defined the same as those in Chemical Formulae 1-1 to 1-3 and 2-1 to 2-3.

$$HS—(CH_2)_{n2}\text{-L-}(CH_2)_{n3}—R^a$$ [Chemical Formula 14]

In Chemical Formula 14,

L may be or may include, e.g., —O—, —S—, —S(=O)—, —S(=O)—, —S(—O)$_2$, —C(=O)—, —(CO)O—, —O(O)O—, a substituted or unsubstituted C1 to C20 alkylene group, a substituted or unsubstituted C2 to C10 alkenylene group, a substituted or unsubstituted C2 to C10 alkynylene group, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, $R^a$ may be or may include, e.g., hydrogen, deuterium, a halogen, a hydroxy group, a thiol group, a cyano group, a nitro group, an amino group, an epoxy group, an oxetane group, a vinyl group, a (meth)acrylate group, a carboxyl group or a salt thereof, a sulfonic acid group or a salt thereof, a phosphoric acid group or a salt thereof, a substituted or unsubstituted C1 to C30 alkyl group, a substituted or unsubstituted C1 to C10 alkoxy group, a substituted or unsubstituted C1 to C30 thioalkyl group, a substituted or unsubstituted C3 to C10 cycloalkyl group, a substituted or unsubstituted C6 to C30 aryl group, a substituted or unsubstituted C2 to C30 heteroaryl group, or a combination thereof, and n2 and n3 may each independently be, e.g., an integer of 0 to 10.

For example, L, $R^a$, n2, and n3 of Chemical Formula 14 may be defined the same as those of Chemical Formula 7.

In an implementation, thiol group-containing compounds represented by Chemical Formula 14 may include, e.g., compounds of the following Group 1.

[Group 1]

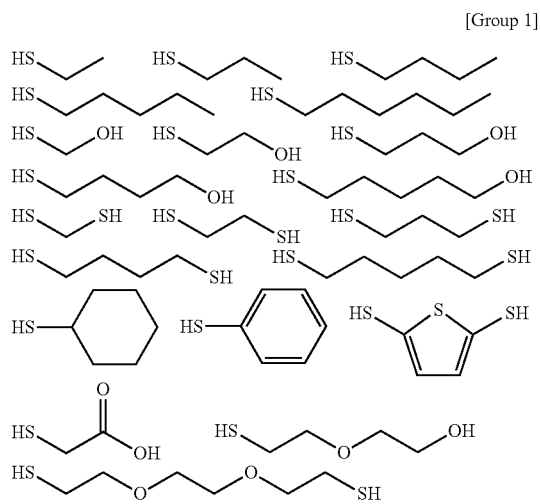

Vinyl group-containing compounds, e.g., Chemical Formulae 12-1 to 12-3 and 13-1 to 13-3, and thiol group-containing compound, e.g., Chemical Formula 14, may be copolymerized by, e.g., including an initiator for a radical polymerization including a radical producing catalyst including an azo functional group, or a radical producing catalyst including a peroxide functional group.

In an implementation, the radical producing catalyst may include, e.g., azobisisobutyronitrile (AIBN), 2,2'-azobis(2-methylpropinonitrile), 2,2'-azobis(2-methylpropionamidine), 1,1'-azobis(cyclohexanecarbonitrile), 4,4'-azobis(4-cyanopentanoic acid), benzoyl peroxide, dicumyl peroxide, lauroyl peroxide, tert-butyl peroxide, 2-butanone peroxide, 2,4-pentanedione peroxide, and the like.

The polymer may have a weight average molecular weight of, e.g., about 1,000 to about 100,000. In an implementation, the polymer may have a weight average molecular weight of, e.g., about 1,000 to about 50,000, or about 1,000 to about 20,000. When the polymer has a weight average molecular weight within the ranges, the amount of carbon and solubility in a solvent of the resist underlayer composition including the polymer may be optimized.

In an implementation, the polymer may be included in the composition in an amount of, e.g., about 0.1 wt % to about 50 wt %, about 0.1 wt % to about 30 wt %, or about 0.1 wt % to about 15 wt %, based on a total weight of the resist underlayer composition. Within the ranges, a thickness, a surface roughness, and a planarization degree of a resist underlayer may be controlled.

The resist underlayer composition may further include, e.g., a cross-linking agent.

The cross-linking agent may include, e.g., a melamine-based, substituted urea-based, or a polymer-based cross-linking agent. In an implementation, it may be a cross-linking agent having at least two cross-linking forming substituents, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, or butoxymethylated thiourea, and the like.

The cross-linking agent may be a cross-linking agent having high heat resistance and may be, e.g., a compound including a cross-linking substituent including an aromatic ring (for example a benzene ring, or a naphthalene ring) in the molecule. The cross-linking agent may have, e.g., two or more cross-linking sites.

In an implementation, the resist underlayer composition may further include, e.g., at least one other polymer of an acryl-based resin, an epoxy-based resin, a novolac resin, a glycoluril-based resin, and a melamine-based resin in addition to the polymer including a structure where the first moiety or the second moiety and the third moiety are combined.

The resist underlayer composition may further include an additive of, e.g., a surfactant, a thermal acid generator, a plasticizer, or a combination thereof.

In an implementation, the surfactant may include, e.g., an alkylbenzenesulfonate salt, an alkylpyridinium salt, polyethylene glycol, a quaternary ammonium salt, and the like.

In an implementation, the thermal acid generator may include, e.g., an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organic sulfonic acid alkylester, and the like.

The additive may be included in the composition in an amount of, e.g., about 0.001 to about 40 parts by weight, based on 100 parts by weight of the resist underlayer composition. Within the ranges, solubility may be improved while optical properties of the resist underlayer composition are not changed.

The solvent may be a suitable solvent having sufficient dissolubility or dispersibility or the polymer and may include. e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, methyl 2-hydroxyisobutyrate, acetylacetone, and ethyl 3-ethoxypropionate.

As described above, the polymer according to an embodiment may have improved solubility and thus may be stable regarding an organic solvent, and accordingly, when a resist underlayer composition including the polymer is, e.g., used as a photoresist underlayer material, the resist underlayer composition may help minimize delamination by a solvent or generation of a byproduct according to generation of a chemical material and the like during the process for forming a photoresist pattern and thus minimize a thickness loss by a photoresist solvent thereon.

The resist underlayer composition according to an embodiment may have excellent coating uniformity and stability and may realize a high refractive index and in addition, may have a fast etch-rate and thus be applied to a lithographic process of using a high energy ray such as EUV (Extreme Ultraviolet), E-beam (Electron Beam), or the like. The lithographic process of using a high energy ray is lithography technology of using EUV light having a very short wavelength ranging from about 10 nm to about 20 nm, for example, about 13.5 nm or light corresponding to an E-beam region and thus forming an ultrafine pattern having a width of less than or equal to about 20 nm.

The patterning process of forming the ultrafine pattern by a high energy ray such as EUV and E-beam may result in a pattern collapse according to a pattern refinement and roughness generation of a photoresist pattern sidewall as well as reflection from a substrate.

When an underlayer is formed by the resist underlayer composition including the polymer according to an embodiment, coating uniformity may be improved due to excellent dissolubility with respect to a solvent, and generation of surface roughness may be minimized. In addition, the underlayer formed of the resist underlayer composition according to an embodiment may have improved flatness and thus may help address the aforementioned issues as well as has optimal reflectance from an etched layer regarding a light source and thus may help suppress a light interference effect.

Another embodiment may provide a resist underlayer manufactured using the resist underlayer composition. The resist underlayer may be obtained by coating the resist underlayer composition on, e.g., a substrate, and then curing it through a heat treatment process. The resist underlayer may be, e.g., an anti-reflection coating.

Hereinafter, a method of forming patterns using the resist underlayer composition is described referring to FIGS. 1 to 5.

FIGS. 1 to 5 illustrate cross-sectional views of stages in a method of forming patterns using a resist underlayer composition according to an embodiment.

Referring to FIG. 1, a subject for etching may be prepared. The etching subject may be a thin layer 102 formed on a semiconductor substrate 100. Hereinafter, the etching subject is the thin layer 102. An entire surface of the thin layer 102 may be washed to remove impurities and the like remaining thereon. The thin layer 102 may be, e.g., a silicon nitride layer, a polysilicon layer, or a silicon oxide layer.

Subsequently, the resist underlayer composition including the polymer having the moiety represented by Chemical Formula 1 or the moiety represented by Chemical Formula 2 and a solvent may be spin-coated on the surface of the washed thin layer 102.

Then, the coated composition may be dried and baked to form a resist underlayer 104 on the thin layer 102. The baking may be performed at, e.g., about 100° C. to about 500° C., or about 100° C. to about 300° C. The resist underlayer composition may be as described above in detail.

Figure 2:
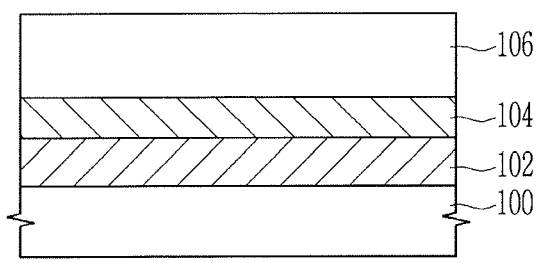

Referring to FIG. 2, a photoresist layer 106 may be formed by coating a photoresist on the resist underlayer 104.

Examples of the photoresist may include a positive-type photoresist containing a naphthoquinone diazide compound and a novolac resin, a chemically-amplified positive photoresist containing an acid generator capable of dissociating acid through exposure, a compound decomposed under a presence of the acid and having increased dissolubility in an alkali aqueous solution, and an alkali soluble resin, a chemically-amplified positive-type photoresist containing an alkali-soluble resin capable of applying a resin increasing dissolubility in an alkali aqueous solution, and the like.

Subsequently, the substrate 100 having the photoresist layer 106 thereon may be primary baked. The primary baking may be performed at about 90° C. to about 120° C.

Figure 3:
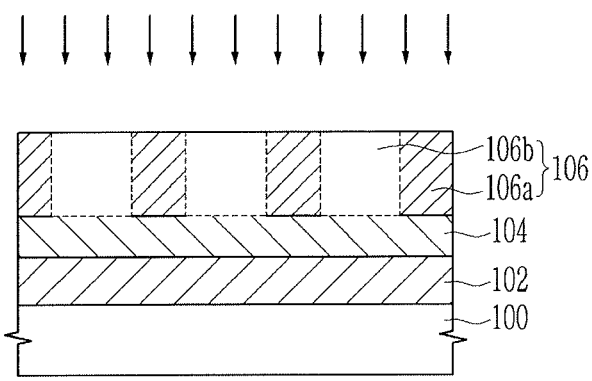

Referring to FIG. 3, the photoresist layer 106 may be selectively exposed.

Exposure of the photoresist layer 106 may be, e.g., performed by positioning an exposure mask having a predetermined pattern on a mask stage of an exposure apparatus and aligning the exposure mask 110 on the photoresist layer 106. Subsequently, a predetermined region of the photoresist layer 106 formed on the substrate 100 selectively reacts with light passing the exposure mask by radiating light into the exposure mask 110.

Examples of the light used during the exposure may be an activated radiation such as light having high energy wavelength of EUV (extreme ultraviolet; wavelength of 13.5 nm), E-beam (electron beam), and the like as well as light having a short wavelength of i-line (365 nm), KrF excimer laser (wavelength of 248 nm), ArF excimer laser (wavelength of 193 nm), and the like.

An exposed region 106b of the photoresist layer 106 may be relatively hydrophilic compared with a non-exposed region 106a of the photoresist layer 106. Accordingly, the exposed region 106b and non-exposed region 106a of the photoresist layer 106 may have different solubility each other.

Subsequently, the substrate 100 may be secondary baked. The secondary baking may be performed at about 90° C. to about 150° C. The exposed region 106b of the photoresist layer may become easily soluble with respect to or in a predetermined solvent due to the secondary baking.

Figure 4:
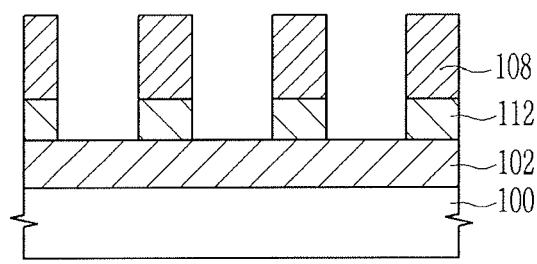

Referring to FIG. 4, the exposed region 106b of the photoresist layer may be dissolved and removed by a developing solution to form a photoresist pattern 108. For example, the exposed region 106b of the photoresist layer may be dissolved and removed by using a developing solution such as tetra-methyl ammonium hydroxide (TMAH) or the like to finish the photoresist pattern 108.

Subsequently, the photoresist pattern 108 may be used as an etching mask to etch the resist underlayer. Through the etching, an organic layer pattern 112 may be formed. The etching may be, e.g., dry etching using etching gas, and the etching gas may be, e.g., $CHF_3$, $CF_4$, $Cl_2$, $BCl_3$, or a mixed gas thereof. As described above, a resist underlayer formed by the resist underlayer composition according to an embodiment may have a fast etch rate, an etching process may be smoothly performed in a short time.

Figure 5:
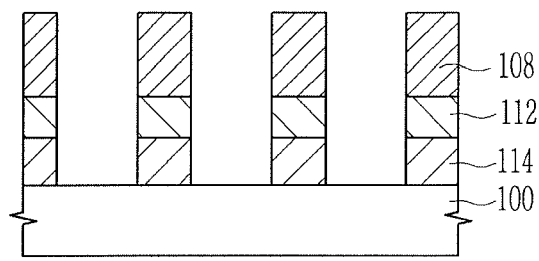

Referring to FIG. 5, the photoresist pattern 108 may be applied as an etching mask to etch the exposed thin layer 102. As a result, the thin layer may be formed into a thin layer pattern 114. During the exposure process, the thin layer pattern 114 formed by an exposure process using an ArF light source may have a width of scores of nanometers to hundreds of nanometers, and the thin layer pattern 114 formed by an exposure process using an EUV light source may have a width of less than or equal to about 20 nm.

Hereinafter, the embodiments are described in more detail through examples regarding synthesis of the polymer and preparation of a resist underlayer composition including the same. However, the embodiments are technically not restricted by the following examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

17.7 g of DAC-EC (1,3-diallyl-5-(2-hydroxyethyl) isocyanurate), 1.1 g of 5-mercaptopentanol, 2.3 g of AIBN (azobisisobutyronitrile), and 15.9 g of N,N-dimethyl formamide (DMF) were put in a 500 ml two-necked round flask, and a condenser is connected thereto. After performing a reaction at 80° C. for 16 hours, the reaction solution was cooled down to ambient temperature. The reaction solution was moved to a 1 L wide mouth bottle and washed twice with 800 g of water. The obtained resin in a gum state was completely dissolved by using 80 g of tetrahydrofuran (THF), and 800 g of toluene was poured thereinto to obtain a precipitate. After removing a solvent therefrom, a vacuum pump was used to remove a residual solvent still remaining to obtain 15 g of a polymer including a structural unit represented by Chemical Formula 8 (weight average molecular weight: 6,800).

[Chemical Formula 8]

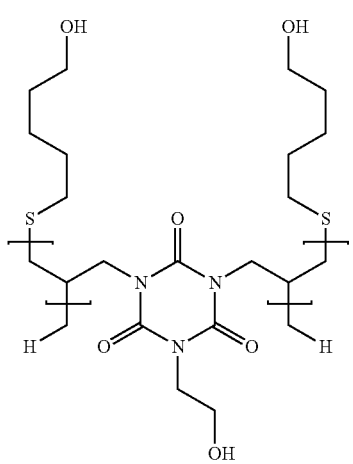

Synthesis Example 2

24.9 g of triallyl isocyanurate, 9.4 g of 2-(2-mercaptoethoxy)ethanol, 1.3 g of AIBN, and 20.0 g of DMF were put in a 500 ml two-necked round flask, and a condenser was connected thereto. After performing a reaction at 80° C. for 21 hours, the reaction solution was cooled down to ambient temperature. The reaction solution was moved to a 1 L wide mouth bottle and then, washed twice with 800 g of water. The obtained resin in a gum state was completely dissolved in 80 g of THF, and 800 g of toluene was poured thereinto to obtain a precipitate. After removing a solvent therefrom, a vacuum pump was used to remove a residual solvent still remaining to obtain 25 g of a polymer including a structural unit represented by Chemical Formula 9 (weight average molecular weight: 17,600).

[Chemical Formula 9]

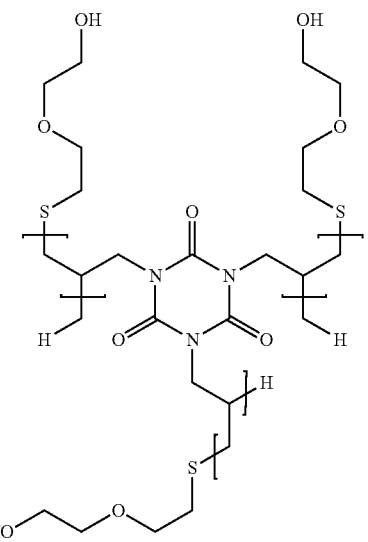

Synthesis Example 3

24.9 g of triallyl cyanurate, 6.0 g of 2-mercaptoacetic acid, 1.3 g of AIBN, and 20.0 g of DMF were put in a 500 ml 2-necked round flask, and a condenser was connected thereto. After performing a reaction at 80° C. for 21 hours, the reaction solution was cooled down to ambient temperature. The reaction solution was moved to a 1 L wide mouth bottle and then, washed twice with 800 g of water. The obtained resin in a gum state was completely dissolved in 80 g of THF, and 800 g of toluene was poured thereinto to obtain a precipitate. After removing a solvent therefrom, a vacuum pump was used to remove a residual solvent still remaining in the resin to obtain 25 g of a polymer including a structural unit represented by Chemical Formula 10 (weight average molecular weight: 14,000).

[Chemical Formula 10]

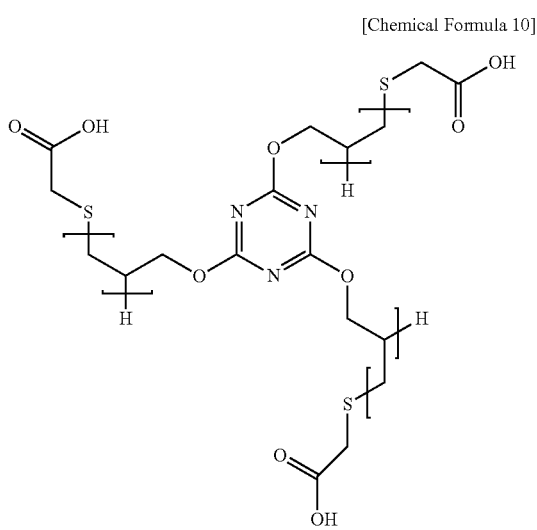

Synthesis Example 4

23.9 g of BCCmAb (1,3,5-triazine-1,3(2H,4H)-dipropanoic acid, dihydro-2,4,6-trioxo-5-(2-propen-1-yl)-,1,3-dimethyl ester), 4.5 g of 5-mercaptopentanol, 1.1 g of AIBN, and 17.0 g of DMF were put in a 500 ml 2-necked round flask, and a condenser was connected thereto. After performing a reaction at 80° C. for 22 hours, the reaction solution was cooled down to ambient temperature. The reaction solution was moved to a 1 L wide mouth bottle and washed twice with 800 g of water. The obtained resin in a gum state was completely dissolved by using 80 g of THF, and then, 800 g of toluene was poured thereinto to obtain a precipitate. After removing a solvent therefrom, a vacuum pump was used to remove a residual solvent still remaining in the resin to obtain 22 g of a polymer including a structural unit represented by Chemical Formula 11 (weight average molecular weight: 1,700).

[Chemical Formula 11]

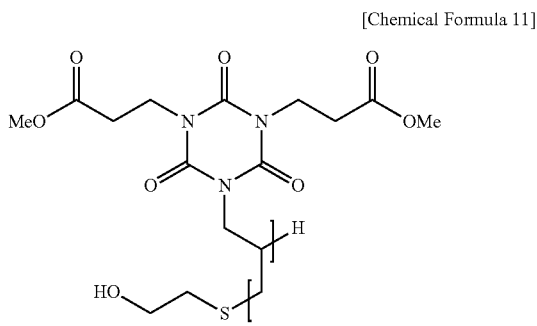

Comparative Synthesis Example 40 g of methyl methacrylate, 52.1 g of 2-hydroxyethylacrylate, 70.4 g of benzyl acrylate, 2 g of AIBN, and 306 g of dioxane were put in a 500 ml 2-necked round flask, and a condenser was connected thereto. The mixture was heated up to 80° C. and reacted for 2.5 hours, and the obtained reaction solution was cooled down to ambient temperature. The reaction solution was moved to a 3 L wide mouth bottle and washed with hexane. The obtained resin was dried at 30° C. in a vacuum oven to remove a solvent therefrom to obtain a polymer including a structural unit represented by Chemical Formula 15 (Mw=12,000).

[Chemical Formula 15]

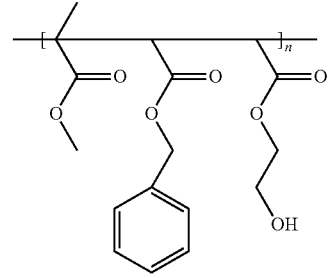

Preparation of Resist Underlayer Composition

Example 1

The polymer prepared in Synthesis Example 1, PD1174 (TCI Inc.; hardener) (15 parts by weight based on 100 parts by weight of the polymer), and pyridinium p-toluene sulfonate (1 part by weight based on 100 parts by weight of the polymer) were dissolved in a mixed solvent of propylene glycol monomethylether and ethyl lactate (weight ratio=1:1), and the solution was stirred for 6 hours to prepare an anti-reflection coating composition.

An amount of the mixed solvent was controlled, so that the polymer was included in a solid content of 1 wt % based on a total weight of the resist underlayer composition.

Examples 2 to 4 and Comparative Example 1

Each resist underlayer composition was prepared according to the same method as Example 1 except for using each polymer according to Synthesis Example 2 to Synthesis Example 4 instead of the polymer of Synthesis Example 1.

Comparative Example 1

A resist underlayer composition was prepared according to the same method as Example 1 except for using the polymer according to Comparative Synthesis Example 1 instead of the polymer of Synthesis Example 1.

Evaluation

Evaluation 1: Evaluation of Optical Properties 2 mL samples of the compositions according to Examples 1 to 4 and Comparative Example 1 were respectively taken, applied on a 4 inch wafer, and spin-coated at 1,500 rpm for 20 seconds by using a spin coater (Mikasa Co., Ltd.). Subsequently, the coated compositions were cured at 230° C. for 90 seconds to form each 30 nm-thick thin layer. A refractive index (n) and an extinction coefficient (k) of each thin layer were measured under a condition of 800 A by using VASE Elliposmeters (J.A. Woollam Co.) and the results are shown in Table 1.

TABLE 1

| | n | k |
|---|---|---|
| Example 1 | 1.93 | 0.27 |
| Example 2 | 1.95 | 0.29 |

TABLE 1-continued

|  | n | k |
| --- | --- | --- |
| Example 3 | 1.98 | 0.3 |
| Example 4 | 1.88 | 0.24 |
| Comparative Example 1 | 1.86 | 0.58 |

Evaluation 2: Coating Uniformity 2 mL samples of each composition according to Examples 1 to 4 and Comparative Example 1 were respectively applied on an 8-inch wafer and then, spin-coated at a main spin speed of 1,500 rpm for 20 seconds by using an auto track (ACT-8, TEL) and cured at 210° C. for 90 seconds to respectively form 300 nm-thick thin layers. Thicknesses of the thin layers horizontally at 51 points were measured to compare uniformity and the results are shown in Table 2.

The smaller coating uniformity (%) is, the more improved coating uniformity is.

TABLE 2

|  | Coating uniformity (%) |
| --- | --- |
| Example 1 | 1.7 |
| Example 2 | 2.0 |
| Example 3 | 1.6 |
| Example 4 | 2.5 |
| Comparative Example 1 | 3.3 |

By way of summation and review, technology of manufacturing an ultra-fine pattern may be considered, and an activated radiation having a short wavelength such as an i-line (365 nm), a KrF excimer laser (wavelength of 248 nm), an ArF excimer laser (wavelength of 193 nm), and the like may be used for exposure of a photoresist. Accordingly, addressing issues the activated radiation due to a diffused reflection from a semiconductor substrate, a standing wave, or the like may include interposing a resist underlayer having optimal reflectance between the photoresist and the semiconductor substrate.

A high energy ray such as EUV (extreme ultraviolet; a wavelength of 13.5 nm), an E-beam (electron beam), and the like as a light or energy source for manufacturing the fine pattern in addition to the activated radiation may be used, and the light source may have no reflection from the substrate. Improving adherence of the resist to the lower layer may be considered to improve a collapse of the pattern. In addition, improvement of etch selectivity and chemical resistance of the resist underlayer in addition to decrease of the problems caused by the light source may be considered.

In addition, improving adherence of the resist underlayer to the resist as well as the etch selectivity and the chemical resistance in addition to the decrease of issues caused by a light source may be considered.

The embodiments may provide a resist underlayer composition having optimal reflectance in a particular wavelength and simultaneously, improved coating properties, and adherence to a photoresist.

The resist underlayer composition according to an embodiment may provide a resist underlayer having improved coating uniformity, increased solubility, and improved optical properties such as a refractive index or absorbance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of Symbols>

| 100: substrate | 102: thin layer |
| --- | --- |
| 104: resist underlayer | 106: photoresist layer |
| 108: photoresist pattern | 110: mask |
| 112: organic layer pattern | 114: thin layer pattern |

What is claimed is:

1. A resist underlayer composition, comprising:

a solvent; and a polymer having a structure where:

at least one of a first moiety represented by one of Chemical Formula 1-1 to Chemical Formula 1-3 is combined with a third moiety represented by Chemical Formula 3, or at least one of a second moiety represented by one of Chemical Formula 2-1 to Chemical Formula 2-3 is combined with a third moiety represented by Chemical Formula 3,

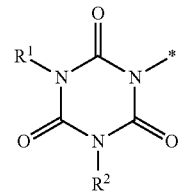

[Chemical Formula 1-1]

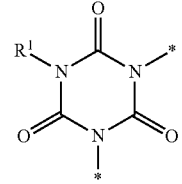

[Chemical Formula 1-2]

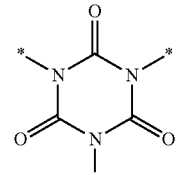

[Chemical Formula 1-3]

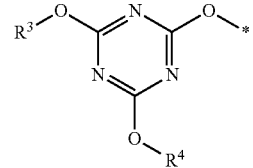

[Chemical Formula 2-1]

-continued

[Chemical Formula 2-2]

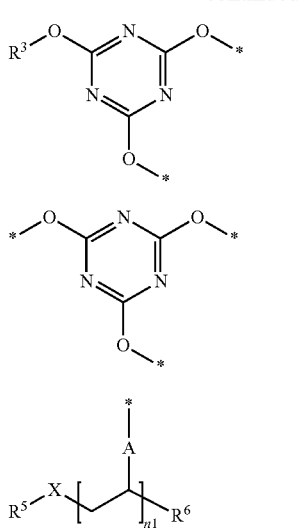

[Chemical Formula 2-3]

[Chemical Formula 3]

wherein, in Chemical Formulae 1-1 to 1-3 and Chemical Formulae 2-1 to 2-3, $R^1$ to $R^4$ are independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, and each * of Chemical Formulae 1-1 to Chemical Formulae 2-3 is a linking point, wherein, in Chemical Formula 3, A is a single bond, a substituted or unsubstituted C1 to C10 alkylene group, —C(=O)—, —(CO)O—, —O(CO)O—, or a combination thereof, X is one of —O—, —S—, —S(=O)—, —S(=O)$_2$—, —C(=O)—, —O(CO)O—, or —NR—, in which R is hydrogen, deuterium, or a C1 to C10 alkyl group, $R^5$ of Chemical Formula 3 is a group represented by Chemical Formula 4,

*—(CH$_2$)$_{n2}$-L-(CH$_2$)$_{n3}$—R$^a$, and    [Chemical Formula 4]

in Chemical Formula 4,

L is —O—, —S—, —S(=O)—, —S(=O)$_2$—, —C(=O)—, —(CO)O—, —O(CO)O—, a substituted or unsubstituted C1 to C20 alkylene group, a substituted or unsubstituted C2 to C10 alkenylene group, a substituted or unsubstituted C2 to C10 alkynylene group, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, $R^a$ is hydrogen, deuterium, a halogen, a hydroxy group, a thiol group, a cyano group, a nitro group, an amino group, an epoxy group, an oxetane group, a vinyl group, a (meth)acrylate group, a carboxyl group or a salt thereof, a sulfonic acid group or a salt thereof, a phosphoric acid group or a salt thereof, a substituted or unsubstituted C1 to C30 alkyl group, a substituted or unsubstituted C1 to C10 alkoxy group, a substituted or unsubstituted C1 to C30 thioalkyl group, a substituted or unsubstituted C3 to C10 cycloalkyl group, a substituted or unsubstituted C6 to C30 aryl group, a substituted or unsubstituted C2 to C30 heteroaryl group, or a combination thereof, provided that when the at least one of the second moiety is combined with the third moiety, $R^a$ is not a substituted C6 to C30 aryl group, n2 and n3 are independently an integer of 0 to 10, and

* is a linking point with X, $R^6$ is hydrogen, deuterium, a substituted or unsubstituted C1 to C30 alkyl group, or a substituted or unsubstituted C6 to C30 aryl group, n1 is an integer of 1 to 10,000, and in Chemical Formula 3, * is a linking point with * of Chemical Formula 1-1 to Chemical Formula 2-3.

2. The resist underlayer composition as claimed in claim 1, wherein X of Chemical Formula 3 is —S—.

3. The resist underlayer composition as claimed in claim 1, wherein, in Chemical Formula 3, A is a substituted or unsubstituted C1 to C5 alkylene group, —C(=O)—, or a combination thereof, X is —S—, and $R^6$ is hydrogen, deuterium, a substituted or unsubstituted C1 to C30 alkyl group, or a substituted or unsubstituted C6 to C30 aryl group.

4. The resist underlayer composition as claimed in claim 1, wherein the polymer is represented by one of Chemical Formula 5-1, Chemical Formula 5-2, Chemical Formula 5-3, Chemical Formula 6-1, Chemical Formula 6-2, or Chemical Formula 6-3:

[Chemical Formula 5-1]

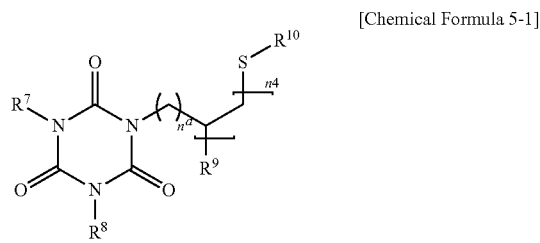

[Chemical Formula 5-2]

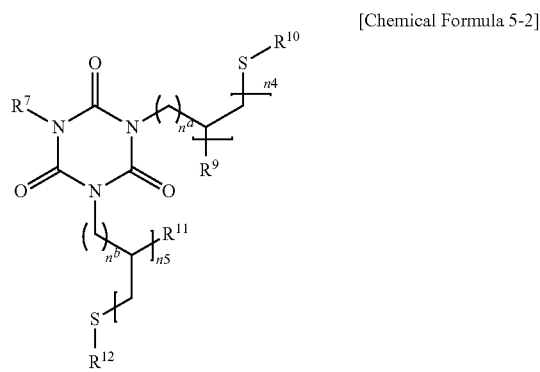

-continued

[Chemical Formula 5-3]

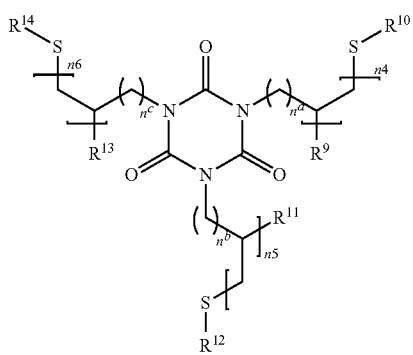

[Chemical Formula 6-1]

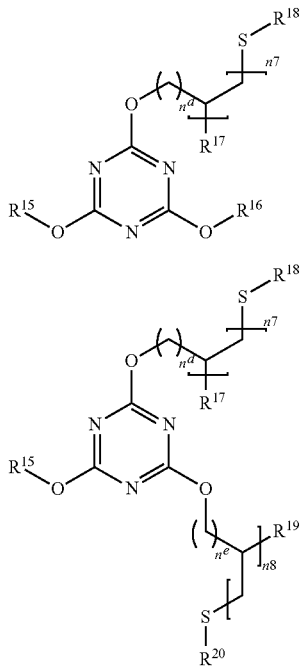

[Chemical Formula 6-2]

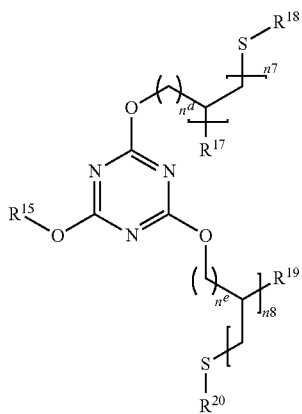

[Chemical Formula 6-3]

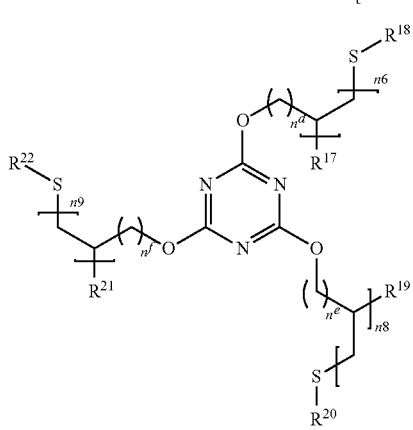

wherein, in Chemical Formula 5-1 to 5-3 and Chemical Formula 6-1 to 6-3, $R^7$, $R^8$, $R^{15}$, and $R^{16}$ are independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, $R^9$, $R^{11}$, $R^{13}$, $R^{17}$, $R^{19}$, and $R^{21}$ are independently hydrogen, deuterium, C1 to C30 substituted or unsubstituted alkyl group, or C6 to C30 substituted or unsubstituted aryl group, R10, R12, R14, R18, R20 and R22 are independently defined the same as R5 of Chemical Formula 4, n4 to n9 are independently an integer of 2 to 100, and $n^a$ to $n^f$ are independently an integer of 1 to 5.

5. The resist underlayer composition as claimed in claim 4, wherein:

in Chemical Formula 4,

L is —O—, —S—, —S(=O)—, —S(=O)$_2$—, —C(=O)—, —(CO)O—, —O(CO)O—, a substituted or unsubstituted C1 to C20 alkylene group, a substituted or unsubstituted C2 to C10 alkenylene group, a substituted or unsubstituted C2 to C10 alkynylene group, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, $R^a$ is hydrogen, a hydroxy group, a thiol group, or a carboxyl group or a salt thereof, n2 and n3 are independently an integer of 0 to 5, and

* of Chemical Formula 4 is a linking point with S.

6. The resist underlayer composition as claimed in claim 4, wherein:

$R^7$, $R^8$, $R^{15}$, and $R^{16}$ are independently a group represented by Chemical Formula 7:

*—(CH$_2$)$_{n10}$-E, and   [Chemical Formula 7]

in Chemical Formula 7,

E is a hydroxy group, a (meth)acrylate group, or a carboxyl group, and n10 is an integer of 0 to 10.

7. The resist underlayer composition as claimed in claim 1, wherein:

$R^1$, $R^2$, $R^3$ and $R^4$ are independently a group represented by Chemical Formula 7:

*—(CH$_2$)$_{n10}$-E, and   [Chemical Formula 7]

in Chemical Formula 7,

E is a hydroxy group, a (meth)acrylate group, or a carboxyl group, and n10 is an integer of 0 to 10.

8. The resist underlayer composition as claimed in claim 1, wherein the polymer is represented by one of Chemical Formulae 8 to 11:

[Chemical Formula 8]

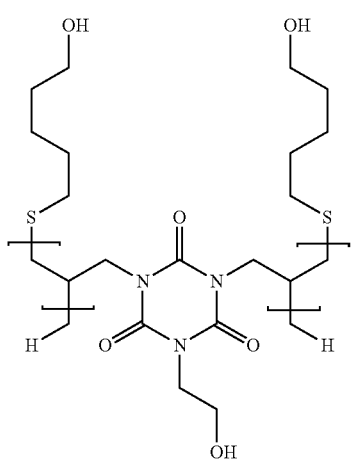

[Chemical Formula 9]

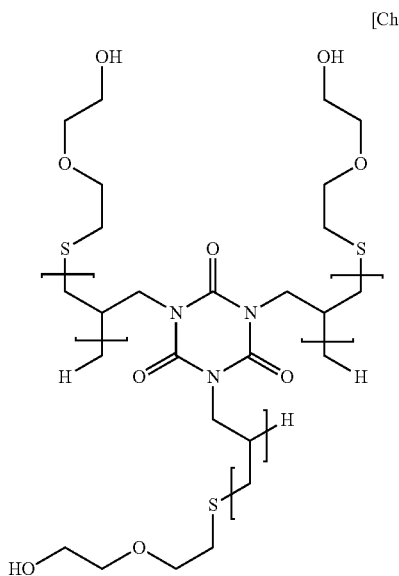

[Chemical Formula 10]

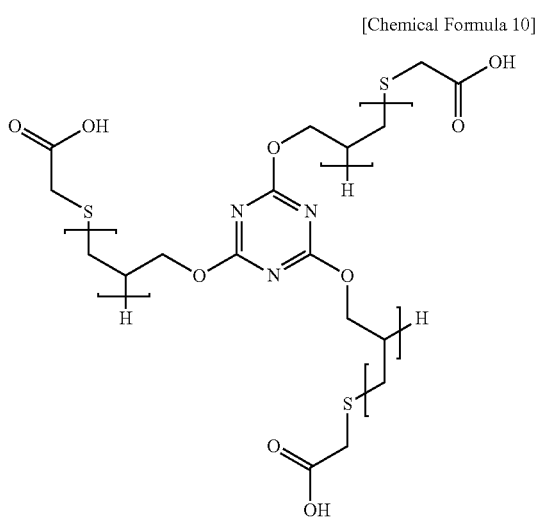

[Chemical Formula 11]

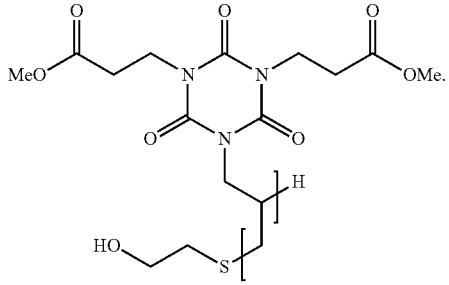

9. The resist underlayer composition as claimed in claim 1, wherein the polymer has a weight average molecular weight of about 1,000 to about 100,000.

10. The resist underlayer composition as claimed in claim 1, wherein the polymer is included in the composition in an amount of about 0.1 wt % to about 50 wt %, based on a total weight of the composition.

11. The resist underlayer composition as claimed in claim 1, further comprising a cross-linking agent having at least two cross-linking sites.

12. The resist underlayer composition as claimed in claim 1, further comprising a surfactant, a thermal acid generator, a plasticizer, or a combination thereof.

13. A method of forming patterns, the method comprising:

forming an etching subject layer on a substrate, coating the resist underlayer composition of claim 1 on the etching subject layer to form a resist underlayer, forming a photoresist pattern on the resist underlayer, and sequentially etching the resist underlayer and the etching subject layer using the photoresist pattern as an etching mask.

14. The method as claimed in claim 13, wherein forming the photoresist pattern includes:

forming a photoresist layer on the resist underlayer, exposing the photoresist layer, and developing the photoresist layer.

15. The method as claimed in claim 13, wherein forming the resist underlayer further includes heat-treating the coated resist underlayer composition at a temperature of about 100° C. to about 500° C.

16. A resist underlayer composition, comprising:

a solvent;

a cross-linking agent having at least two cross-linking sites, a surfactant, a thermal acid generator, a plasticizer, or a combination thereof, and a polymer having a structure where:

at least one of a first moiety represented by one of Chemical Formula 1-1 to Chemical Formula 1-3 is combined with a third moiety represented by Chemical Formula 3, or at least one of a second moiety represented by one of Chemical Formula 2-1 to Chemical Formula 2-3 is combined with a third moiety represented by Chemical Formula 3,

[Chemical Formula 1-1]

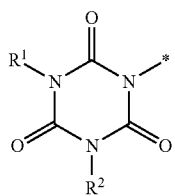

[Chemical Formula 1-2]

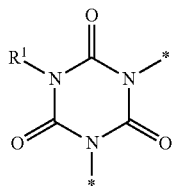

[Chemical Formula 1-3]

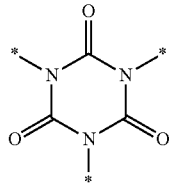

[Chemical Formula 2-1]

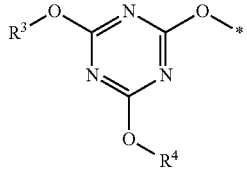

[Chemical Formula 2-2]

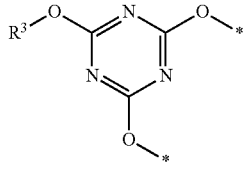

[Chemical Formula 2-3]

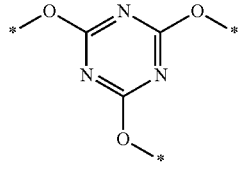

[Chemical Formula 3]

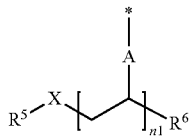

wherein, in Chemical Formulae 1-1 to 1-3 and Chemical Formulae 2-1 to 2-3, $R^1$ to $R^4$ are independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C10 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, and each * of Chemical Formulae 1-1 to Chemical Formulae 2-3 is a linking point, wherein, in Chemical Formula 3, A is a single bond, a substituted or unsubstituted C1 to C10 alkylene group, —C(=O)—, —(CO)O—, —O(CO)O—, or a combination thereof, X is one of —O—, —S—, —S(=O)—, —S(=O)$_2$—, —C(=O)—, —O(CO)O—, or —NR—, in which R is hydrogen, deuterium, or a C1 to C10 alkyl group, $R^5$ is deuterium, a halogen, a hydroxy group, a cyano group, a nitro group, an amino group, an epoxy group, a vinyl group, a (meth)acrylate group, an oxetane group, a thiol group, a carboxyl group or a salt thereof, a sulfonic acid group or a salt thereof, a phosphoric acid group or a salt thereof, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C3 to C10 cycloalkyl group, a substituted or unsubstituted C1 to C30 thioalkyl group, a substituted or unsubstituted C6 to C30 aryl group, a substituted or unsubstituted C2 to C30 heteroaryl group, a substituted or unsubstituted C6 to C30 aryloxy group, a substituted or unsubstituted C6 to C30 thioaryl group, or a combination thereof, $R^6$ is hydrogen, deuterium, a substituted or unsubstituted C1 to C30 alkyl group, or a substituted or unsubstituted C6 to C30 aryl group, n1 is an integer of 1 to 10,000, and

* is a linking point with * of Chemical Formula 1-1 to Chemical Formula 2-3.

17. A method of forming patterns, the method comprising:

forming an etching subject layer on a substrate, coating a resist underlayer composition on the etching subject layer to form a resist underlayer, forming a photoresist pattern on the resist underlayer, and sequentially etching the resist underlayer and the etching subject layer using the photoresist pattern as an etching mask, wherein the resist underlayer composition includes, a solvent; and a polymer having a structure where:

at least one of a first moiety represented by one of Chemical Formula 1-1 to Chemical Formula 1-3 is combined with a third moiety represented by Chemical Formula 3, or at least one of a second moiety represented by one of Chemical Formula 2-1 to Chemical Formula 2-3 is combined with a third moiety represented by Chemical Formula 3,

[Chemical Formula 1-1]

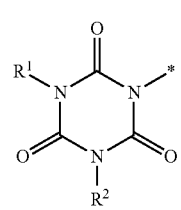

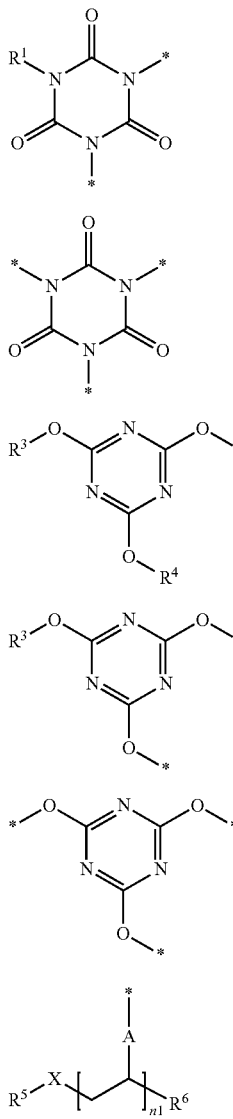

wherein, in Chemical Formulae 1-1 to 1-3 and Chemical Formulae 2-1 to 2-3, $R^1$ to $R^4$ are independently hydrogen, deuterium, a halogen, a hydroxy group, a cyano group, a nitro group, an amino group, an epoxy group, a vinyl group, a (meth) acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, and each * of Chemical Formulae 1-1 to Chemical Formulae 2-3 is a linking point, wherein, in Chemical Formula 3, A is a single bond, a substituted or unsubstituted C1 to C10 alkylene group, —C(=O)—, —(CO)O—, —O(CO)O—, or a combination thereof, X is one of —O—, —S—, —S(=O)—, —S(=O)$_2$—, —C(=O)—, —O(CO)O—, or —NR—, in which R is hydrogen, deuterium, or a C1 to C10 alkyl group, $R^5$ is deuterium, a halogen, a hydroxy group, a cyano group, a nitro group, an amino group, an epoxy group, a vinyl group, a (meth)acrylate group, an oxetane group, a thiol group, a carboxyl group or a salt thereof, a sulfonic acid group or a salt thereof, a phosphoric acid group or a salt thereof, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C3 to C10 cycloalkyl group, a substituted or unsubstituted C1 to C30 thioalkyl group, a substituted or unsubstituted C6 to C30 aryl group, a substituted or unsubstituted C2 to C30 heteroaryl group, a substituted or unsubstituted C6 to C30 aryloxy group, a substituted or unsubstituted C6 to C30 thioaryl group, or a combination thereof, $R^6$ is hydrogen, deuterium, a substituted or unsubstituted C1 to C30 alkyl group, or a substituted or unsubstituted C6 to C30 aryl group, n1 is an integer of 1 to 10,000, and

* is a linking point with * of Chemical Formula 1-1 to Chemical Formula 2-3.

* * * * *